(12) United States Patent
Fang et al.

(10) Patent No.: US 9,570,653 B2
(45) Date of Patent: Feb. 14, 2017

(54) LIGHT-EMITTING SEMICONDUCTOR STRUCTURE AND METHOD FOR FABRICATING LIGHT-EMITTING DIODE DEVICE

(75) Inventors: Kuo-Lung Fang, Zhudong Township, Hsinchu County (TW); Chi-Wen Kuo, Tainan (TW); Jun-Rong Chen, Taichung (TW); Chih-Hao Yang, Taipei (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 41 days.

(21) Appl. No.: 13/590,474

(22) Filed: Aug. 21, 2012

(65) Prior Publication Data
US 2013/0048945 A1   Feb. 28, 2013

(30) Foreign Application Priority Data
Aug. 22, 2011   (TW) .............. 100129909 A (51) Int. Cl.
| H01L 33/20 | (2010.01) |
| H01L 33/50 | (2010.01) |
| H01L 33/06 | (2010.01) |
| H01L 33/00 | (2010.01) |
| H01L 33/08 | (2010.01) |

(52) U.S. Cl.
CPC ........... *H01L 33/20* (2013.01); *H01L 33/0079* (2013.01); *H01L 33/06* (2013.01); *H01L 33/50* (2013.01); *H01L 33/505* (2013.01); *H01L 33/08* (2013.01)

(58) Field of Classification Search
CPC ......... H01L 33/50; H01L 33/06; H01L 33/505
USPC ..................... 257/79, 98, E33.002
See application file for complete search history.

(56) References Cited

U.S. PATENT DOCUMENTS

| 6,985,275 B2* | 1/2006 | Miyazawa | H01L 51/5262 313/503 |
| 2005/0140281 A1* | 6/2005 | Park | H01L 51/525 313/505 |
| 2005/0279990 A1* | 12/2005 | Liu | H01L 33/38 257/13 |
| 2006/0017381 A1* | 1/2006 | Xin | C09K 11/7718 313/509 |
| 2008/0315236 A1* | 12/2008 | Lu | H01L 33/387 257/98 |
| 2012/0104409 A1* | 5/2012 | Chu et al. | 257/76 |

\* cited by examiner

*Primary Examiner* — Amar Movva
(74) *Attorney, Agent, or Firm* — McClure, Qualey & Rodack, LLP (57) ABSTRACT

A method for fabricating a light-emitting device is provided. The method includes: providing a substrate; forming a sacrificial dielectric layer on the substrate, wherein the sacrificial dielectric layer is a structure containing voids; forming a buffer layer on the sacrificial dielectric layer; forming an epitaxial light-emitting structure on the buffer layer; forming a metal bonding layer on the epitaxial light-emitting structure; bonding the metal bonding layer to a thermally conductive substrate; and wet etching the sacrificial dielectric layer for to remove the substrate.

8 Claims, 10 Drawing Sheets

LIGHT-EMITTING SEMICONDUCTOR STRUCTURE AND METHOD FOR FABRICATING LIGHT-EMITTING DIODE DEVICE

This application claims the benefit of Taiwan application Serial No. 100129909, filed Aug. 22, 2011, the subject matter of which is incorporated herein by reference.

BACKGROUND OF THE INVENTION

Field of the Invention

The invention relates in general to a method for fabricating a light-emitting diode (LED) device, and more particularly to a method for the fabricating LED device, wherein the sacrificial dielectric layer is wet etched to remove a substrate.

Description of the Related Art

Light-emitting diode (LED) has a P/N junction and emits a light when a voltage is applied to the P/N junction. LED elements can be widely used in various fields, such as indicators, sign boards, illumination, and other illuminating elements. Due to the advantages of small sizes, long lifespan, low power consumption, and high luminosity, LED has gradually replaced conventional lamps and become a most important light-emitting element.

In general, the LED device may include a substrate, a buffer layer formed on the substrate, and an epitaxial light-emitting structure formed on the buffer layer. When emitting a light, the LED generates heat, and the light-emitting performance of the LED will deteriorate if the heat cannot be dissipated. The use of a thermally conductive substrate helps to dissipate the heat generated by the LED device. Some commonly used LED substrates, such as a sapphire substrate, despite being excellent epitaxy growth substrates, have low heat transfer coefficients and cannot produce satisfactory thermal transfer effects. A commonly used method for resolving the above problem includes: removing the substrate by a laser lift-off process; and then bonding a part of the LED removed from the substrate to a thermally conductive substrate. A vertical type GaN LED device is taken for example. Firstly, an undoped GaN layer is grown on a sapphire substrate. Next, an n-type GaN layer, a multiple quantum well, a p-type GaN layer, and a metal layer are sequentially formed on the undoped GaN layer, wherein the position of the n-type GaN layer and the position of the p-type GaN layer are exchangeable. Then, the sapphire substrate is removed by laser lift-off technology, and the above-mentioned structure having the undoped GaN layer, the n-type GaN layer, the multiple quantum well, the p-type GaN layer, and the metal layer is bonded to a metal substrate such as a copper substrate via a metal layer. Thus, the LED device has a thermally conductive metal substrate. However, the method for fabricating a LED device by using a laser lift-off process results in a poor yield, and the yield is even worse for large-size substrates (such as ≥3"). Therefore, a substrate removal process which produces better yields than the conventional laser lift-off process does is needed to replace the conventional laser lift-off process.

SUMMARY OF THE INVENTION

The invention is directed to a method for fabricating a light-emitting diode (LED) device. The method includes: providing a substrate; forming a sacrificial dielectric layer on the substrate, wherein the sacrificial dielectric layer is a single- or multiple-layer structure containing voids; forming a buffer layer on the sacrificial dielectric layer; forming an epitaxial light-emitting structure on the buffer layer; forming a metal bonding layer on the epitaxial light-emitting structure; bonding the metal bonding layer to a thermally conductive substrate; and wet etching the sacrificial dielectric layer to remove the substrate.

The above and other aspects of the invention will become better understood with regard to the following detailed description of the preferred but non-limiting embodiment(s). The following description is made with reference to the accompanying drawings.

DETAILED DESCRIPTION OF THE INVENTION

A number of embodiments are disclosed below with accompanying drawings for elaborating the invention. The same designations used in the drawings or description denote the same or similar elements, and the shapes or thicknesses of the elements in the drawings may be augmented or simplified for a convenient denotation. Moreover, the elements of the drawings are elaborated respectively. It should be noted that the elements not illustrated in the drawings or literally described should have shapes that are generally known to anyone who is skilled in the technology of the invention. Besides, when a particular layer is described as being on or above another layer (or base), this indicates that the layer and the other layer (or base) are in direct contact or there may be an additional layer between the two layers. Also, the embodiments disclosed below are used merely for elaborating the invention, not for limiting the scope of protection of the invention.

The invention provides a method which replaces a laser lift-off process to achieve a better yield when removing the substrate. In the invention, the substrate is removed by forming a single- or multiple-layer sacrificial dielectric structure containing voids on the substrate and then wet etching the sacrificial dielectric layer.

Figure 1A:
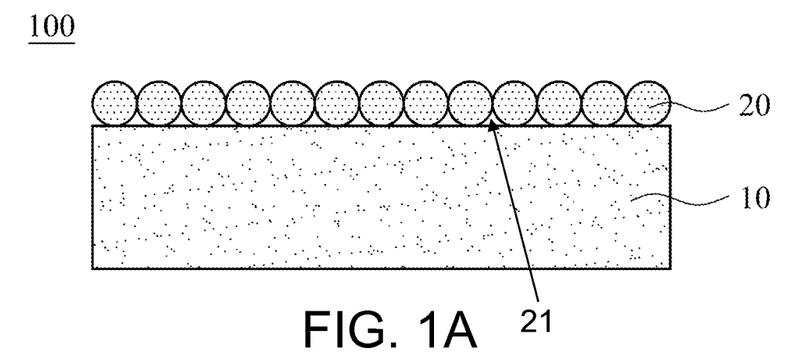
FIGS. 1A~1I are cross-sectional views showing a process of fabricating a LED device according to an embodiment of the invention.

FIGS. 1A~1I are cross-sectional views showing a process of fabricating a LED device 100 according to an embodiment of the invention. Referring to FIG. 1A. Firstly, a substrate 10 is provided, wherein the substrate may be various substrates suitable for growing the epitaxial light-emitting structure such as a sapphire substrate, a silicon carbide substrate, a GaN substrate, an AlN substrate, a silicon substrate, and etc. Next, a sacrificial dielectric layer 20 is formed on and in contact with the substrate 10, wherein the sacrificial dielectric layer 20 is a single- or multiple-layer structure containing voids 21 identified by the sacrificial dielectric layer 20 and the substrate 10, thus the substrate 10 and the sacrificial dielectric layer 20 can be conveniently separated from each other in subsequent processes. In some embodiments, the sacrificial dielectric layer 20 may be a single- or multiple-layer spherical structure, and the sphere diameter is about 1~1000 nanometers. The sacrificial dielectric layer 20 having a single- or multiple-layer spherical structure can be formed by such as spin coating or dip coating. It is noted that when the sacrificial dielectric layer 20 is a single- or multiple-layer spherical structure, the spheres on the spherical layer are preferably arranged according to sphere packing, such that the buffer layer 30 and/or the epitaxial light-emitting structure 40 is less likely to be partly formed on the substrate 10, referring to the structures shown in FIGS. 1B and 1C. In other embodiments, the sacrificial dielectric layer 20, which may be a single- or multiple-layer mesh structure, can be formed by such as deposition, lithography, or an etching process. Under such circumstance, the buffer layer 30 and/or the epitaxial light-emitting structure 40 will be subsequently formed on the substrate 10. The dielectric materials of the sacrificial dielectric layer 20 may include silica, silicon nitride, silicon oxynitride, or a combination thereof.

Figure 1B:
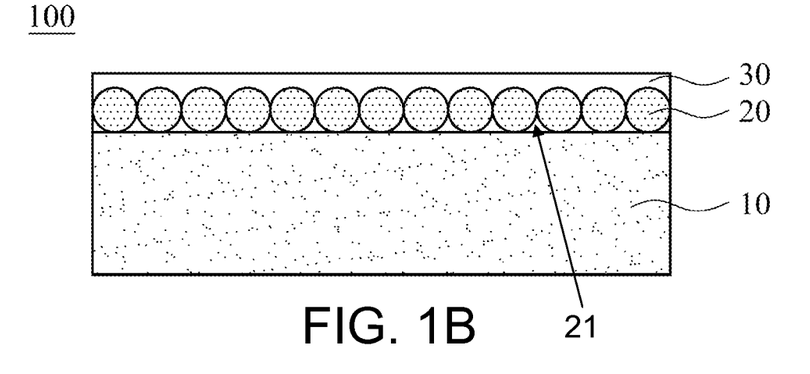

Referring to FIG. 1B, a buffer layer 30 is formed on the sacrificial dielectric layer 20 after the sacrificial dielectric layer 20 is formed on the substrate 10. The buffer layer 30 may be formed by a chemical vapor deposition process, a physical vapor deposition process, or other suitable processes. The chemical vapor deposition process is such as a metal organic chemical vapor deposition process, and the physical vapor deposition process is such as a sputtering or an evaporation process. The materials of the buffer layer include single layer or multiple layers of AlN, GaN, $In_xGa_yN$, or $Al_xGa_yN$, wherein $0 \leq x, y \leq 1$. However, the buffer layer may also be formed by other similar materials. In some embodiments, the thickness of the buffer layer is about 10-50 nanometers.

Figure 1C:
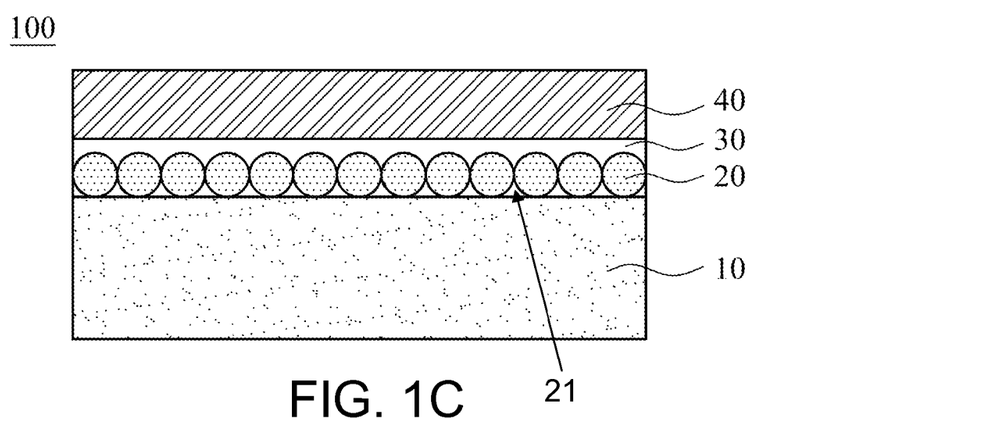

Then, as shown in FIG. 1C, an epitaxial light-emitting structure 40 is formed on the buffer layer 30. The structure of the epitaxial light-emitting structure 40 may be a generally known epitaxial light-emitting structure, which at least includes an n-doped semiconductor layer, a p-doped semiconductor layer, and a multiple quantum well formed between the n-doped semiconductor layer and the p-doped semiconductor layer. The materials of the epitaxial light-emitting structure 40 include AlN, GaN, InGaN, GaAsP, AlGaAs, AlGaInP, AlGaN, AlInGaN, and etc, and the emitted light may be red, green, blue, ultra-velvet, or any suitable color.

Figure 1D:
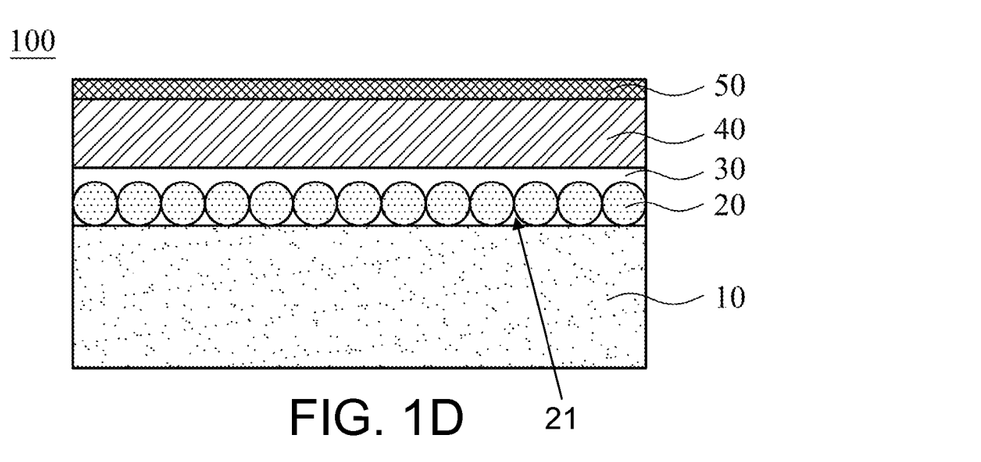

Referring to FIG. 1D, a metal bonding layer 50 is formed on the epitaxial light-emitting structure after the epitaxial light-emitting structure 40 is formed on the buffer layer 30. The metal bonding layer 50 is for bonding to a thermally conductive substrate 60, such that the LED device, which includes the substrate 10, the sacrificial dielectric layer 20, the buffer layer 30, and the epitaxial light-emitting structure 40, can be disposed on the thermally conductive substrate 60. The materials of metal bonding layer 50 may include Au, Ti, W, Cr, Ag, Ni, Pt, Rh, Al, In, Sn, other suitable metals, a combination thereof, or an alloy.

Figure 1E:
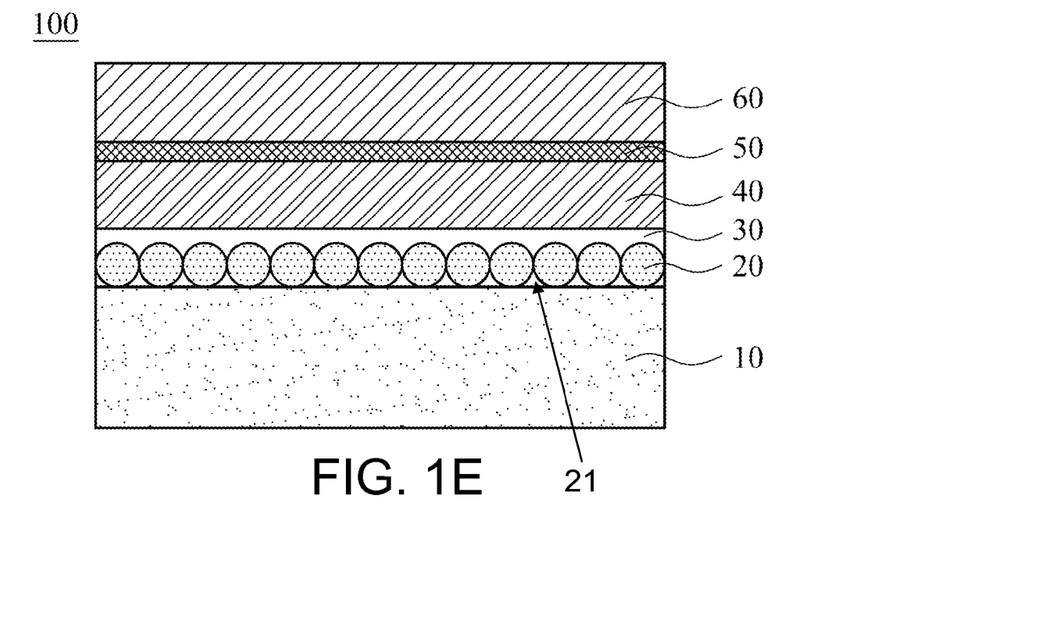
Figure 1F:
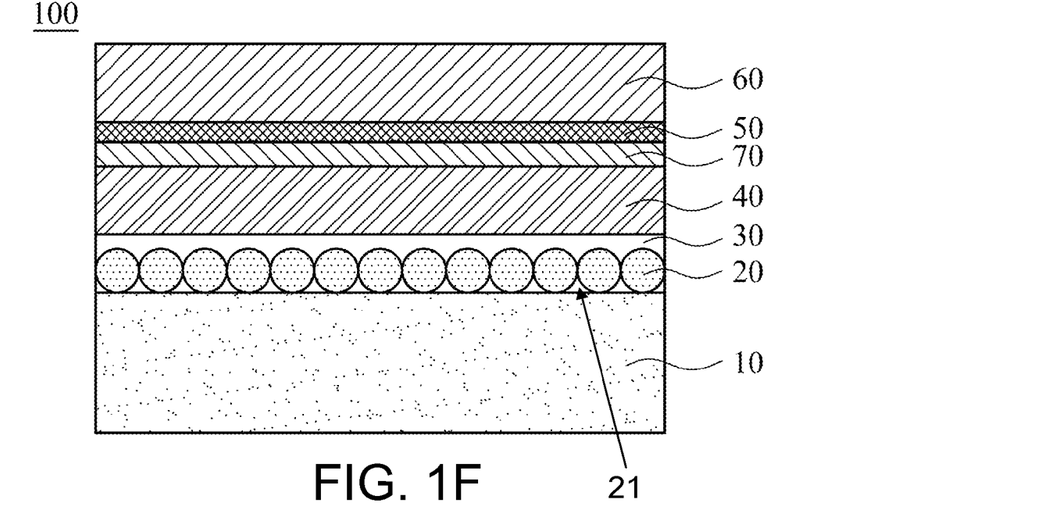

Then, the metal bonding layer 50 is bonded to the thermally conductive substrate 60, as shown in FIG. 1E. A bonding pad (not shown) may be optionally formed on the thermally conductive substrate 60 for bonding the metal bonding layer 50 and the thermally conductive substrate 60. In other embodiments, a contact metal layer 70 is formed on the epitaxial light-emitting structure 40 for establishing an Ohm contact, as shown in FIG. 1F, before the metal bonding layer 50 is formed. The materials of the contact metal layer 70 may include Ni, Ag, Au, Cu, other suitable metals, transparent conductive oxide such as indium tin oxide (ITO), or a combination thereof. The contact metal layer 70 may be formed by a physical vapor deposition process or an atomic layer deposition process. The physical vapor deposition process may include such as evaporation, sputtering, and pulse laser evaporation.

Then, a wet etching process is performed to remove the sacrificial dielectric layer 20. The wet etching solution is such as an acid etching solution. For example, when the sacrificial dielectric layer 20 is formed by silicon dioxide, a solution containing hydrofluoric acid can be used in the wet etching process. In other embodiments, anyone who is skilled in the technology of the invention may select suitable etching solutions according to the materials of the sacrificial dielectric layer 20. Since the sacrificial dielectric layer 20 has a void structure formed between the sacrificial dielectric layer 20 and the substrate 10, the wet etching solution may enter the voids 21 to expedite the etching process. After the sacrificial dielectric layer 20 is wet etched, the substrate 10 is naturally separated from the other part of the LED device 100, as shown in FIG. 1E, to form the structure of the LED device 100 as shown in FIG. 1G, wherein the LED device 100 has been disposed upside-down.

For recycling the substrate 10, after the substrate 10 is removed, anyone who is skilled in the technology of the invention may remove the residuals from the buffer layer 30 and/or the epitaxial light-emitting structure 40 left on the substrate by using an etching solution including sulfuric acid and phosphate or any other generally known etching solutions.

Figure 1G:
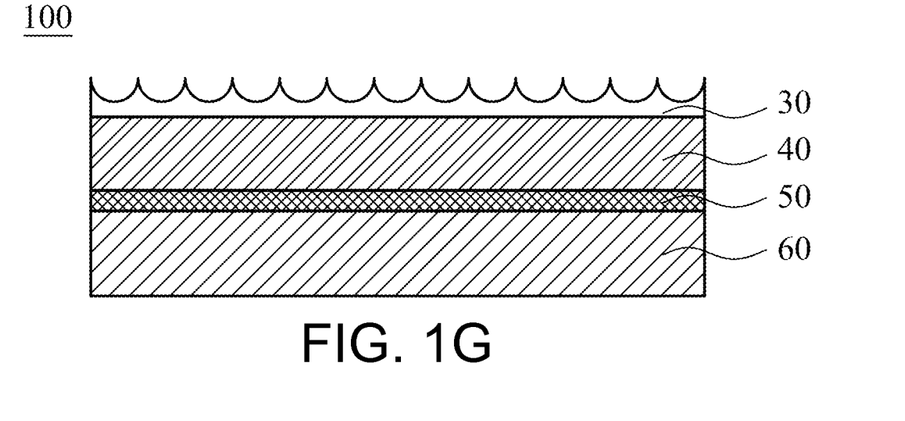

Although the buffer layer 30 is still disposed on the epitaxial light-emitting structure 40, as shown in FIG. 1G, the buffer layer 30 can also be wet etched and removed along with the sacrificial dielectric layer 20. In other embodiments, after the sacrificial dielectric layer 20 is wet etched to remove the substrate 10, the buffer layer 30 (not shown) on the epitaxial light-emitting structure 40 is dry etched and removed.

Figure 1H:
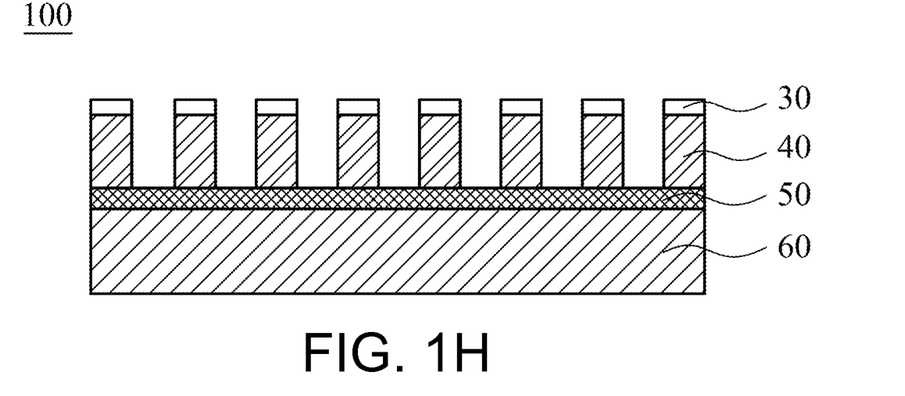

Then, the epitaxial light-emitting structure 40 is patterned by lithography and an etching process, wherein in the etching process, the buffer layer 30 (if any), the epitaxial light-emitting structure 40, and the contact metal layer 70 (if any) are penetrated, but the metal bonding layer 50 is not penetrated, such that a nano-rod structure is formed, as shown in FIG. 1H. The nano-rod structure includes the buffer layer 30 (if any), the epitaxial light-emitting structure 40, and the contact metal layer 70 (if any).

Figure 1I:
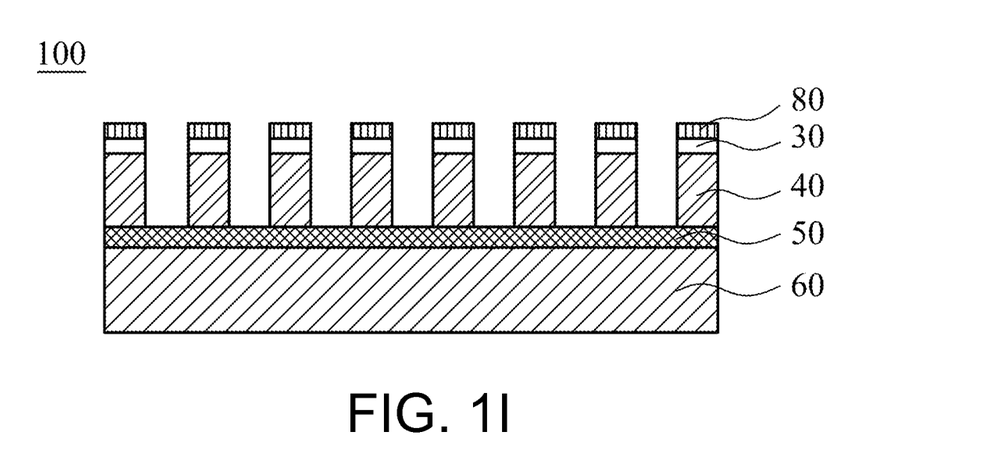

In some embodiments, after the nano-rod structure is formed, a conductive pad 80 is optionally formed on the epitaxial light-emitting structure 40, as shown in FIG. 1I. The materials of the conductive pad include Au, Ag, Cu, Al, Ni, Ti, other suitable metals, a combination thereof, or an alloy.

After the substrate 10 is removed, the thermally conductive substrate 60 is laser-cut along the nano-rod structure to obtain a plurality of grains.

The above elaboration shows that by forming the sacrificial dielectric layer 20, which is a single- or multiple-layer structure containing voids 21 identified by the sacrificial dielectric layer 20 and the substrate 10, the subsequent process of removing the substrate 10 is made easier, so the method of the invention may replace conventional laser lift-off processes and have higher yields. In the method for fabricating the LED device 100 disclosed in above embodiment, the metal bonding layer is bonded to the thermally conductive substrate 60, and then the epitaxial light-emitting structure is patterned to form a nano-rod structure, thus the dimension of the grain is defined, and the conductive pad is optionally formed on the nano-rod structure.

Figure 2A:
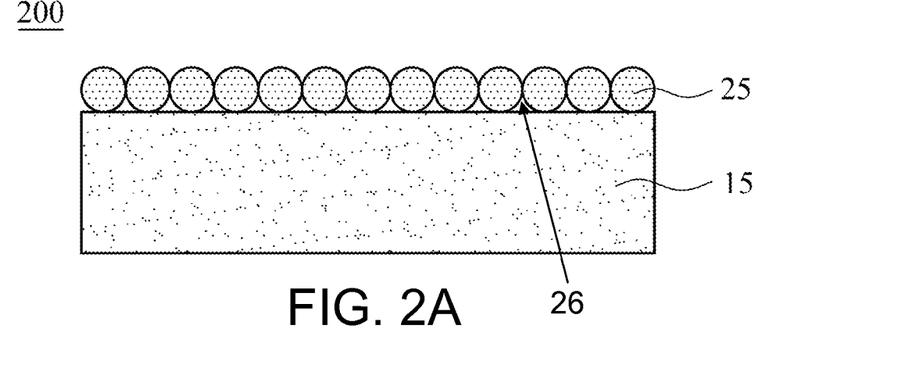
FIGS. 2A~2I are cross-sectional views showing a process of fabricating a LED device according to another embodiment of the invention.

FIGS. 2A~2I are cross-sectional views showing a process of fabricating a LED device 200 according to another embodiment of the invention. The components in FIGS. 2A~2I that are similar to that in FIG. 1A~1I are designated by adding "5" to the numeric designations of the components from FIGS. 1A~1I. The present embodiment is different from the above embodiment in that, firstly, a patterning process is performed to form a nano-rod structure; next, a bonding process is performed on the thermally conductive substrate 65; and lastly, a conductive pad is optionally formed on the nano-rod structure. Referring to FIG. 2A, firstly, a substrate 15 is provided, wherein the substrate may be various substrates suitable for growing the epitaxial light-emitting structure, such as a sapphire substrate, a silicon carbide substrate, a GaN substrate, an AlN substrate, a silicon substrate, and etc. Next, a sacrificial dielectric layer 25 is formed on and in contact with the substrate 15, wherein the sacrificial dielectric layer 25 is a single- or multiple-layer structure containing voids 26 identified by the sacrificial dielectric layer 25 and the substrate 15, thus the substrate 15 and the sacrificial dielectric layer 25 can be conveniently separated from each other in subsequent processes. In some embodiments, the sacrificial dielectric layer 25 may be a single- or multiple-layer spherical structure, and the sphere diameter is about 1~1000 nanometers. The sacrificial dielectric layer 25 having a single- or multiple-layer spherical structure can be formed by such as spin coating or dip coating. It is noted that when the sacrificial dielectric layer 25 is a single- or multiple-layer spherical structure, the spheres on the spherical layer are preferably arranged according to sphere packing so that the buffer layer 35 and/or the epitaxial light-emitting structure 45 is less likely to be partly formed on the substrate 15, referring to the structures shown in FIGS. 2B and 2C. In other embodiments, the sacrificial dielectric layer 25, which may be a single- or multiple-layer mesh structure, can be formed by such as deposition, lithography, or an etching process. Under such circumstance, the buffer layer 35 and/or the epitaxial light-emitting structure 45 will be subsequently formed on the substrate 15. The dielectric materials of the sacrificial dielectric layer 25 may include silica, silicon nitride, silicon oxynitride, or a combination thereof.

Figure 2B:
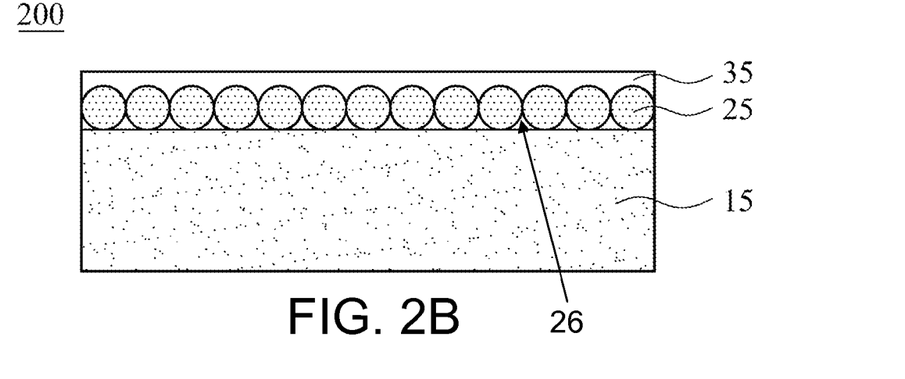

Referring to FIG. 2B, a buffer layer 35 is formed on the sacrificial dielectric layer 25 after the sacrificial dielectric layer 25 is formed on the substrate 15. The buffer layer 35 may be formed by a chemical vapor deposition process, a physical vapor deposition process, or other suitable processes. The chemical vapor deposition process is such as a metal organic chemical vapor deposition process, and the physical vapor deposition process is such as a sputtering or an evaporation process. The materials of the buffer layer include single layer or multiple layers of AlN, GaN, InxGayN, or AlxGayN, wherein 0≤x,y≤1. However, the buffer layer may also be formed by other similar materials. In some embodiments, the thickness of the buffer layer is about 10~50 nanometers.

Figure 2C:
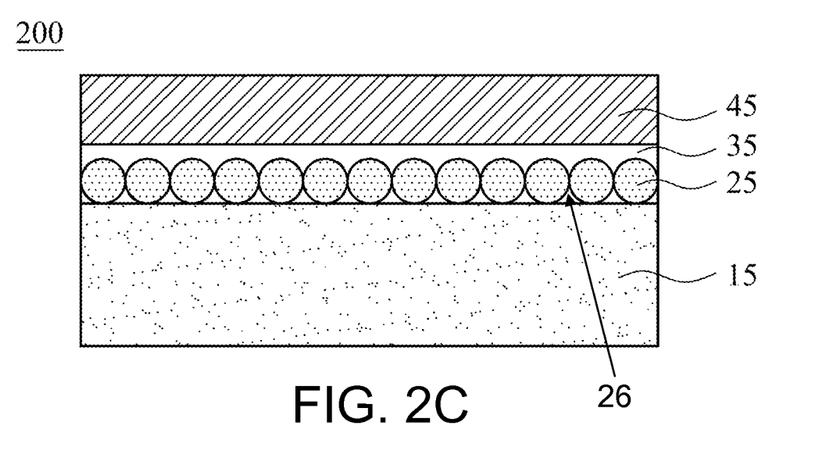

Then, as shown in FIG. 2C, an epitaxial light-emitting structure 45 is formed on the buffer layer 35. The structure of the epitaxial light-emitting structure 45 may be a generally known epitaxial light-emitting structure, which at least includes an n-doped semiconductor layer, a p-doped semiconductor layer, a multiple quantum well formed between the n-doped semiconductor layer and the p-doped semiconductor layer, an N electrode electrically connected to the n-doped semiconductor layer, and a P electrode electrically connected to the p-doped semiconductor layer. The materials of the epitaxial light-emitting structure 45 include AlN, GaN, InGaN, GaAsP, AlGaAs, AlGaInP, AlGaN, AlInGaN, and etc.

Figure 2D:
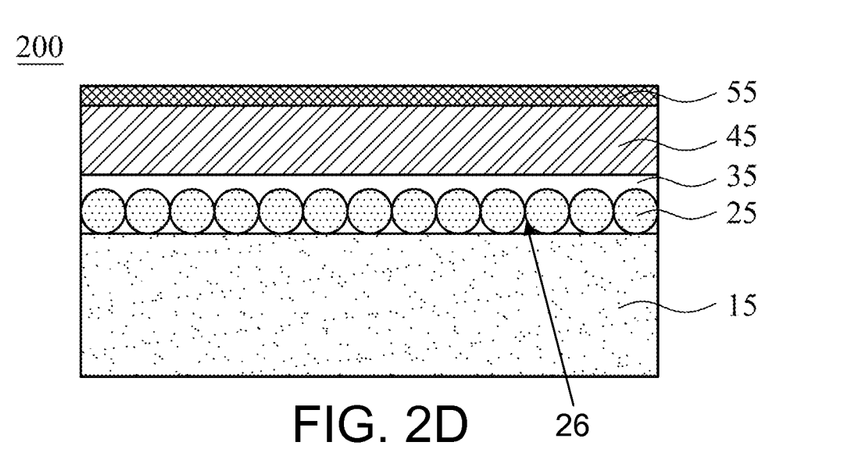
Figure 2E:
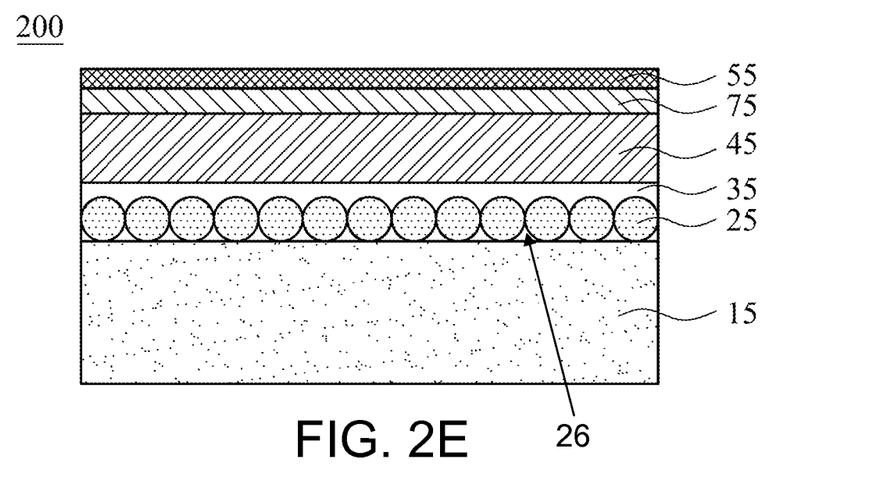

Referring to FIG. 2D, a metal bonding layer 55 is formed on the epitaxial light-emitting structure after the epitaxial light-emitting structure 45 is formed on the buffer layer 35. The metal bonding layer 55 is bonded to a thermally conductive substrate 65, such that the LED device, which includes the substrate 15, the sacrificial dielectric layer 25, the buffer layer 35, and the epitaxial light-emitting structure 45, can be disposed on the thermally conductive substrate 65. The materials of metal bonding layer 55 may include Au, W, Cr, Ag, Ti, Ni, Pt, Rh, Al, In, Sn, or other suitable metals. In other embodiments, a contact metal layer 75 is formed on the epitaxial light-emitting structure 45, as shown in FIG. 2E, before the metal bonding layer 55 is formed.

Figure 2F:
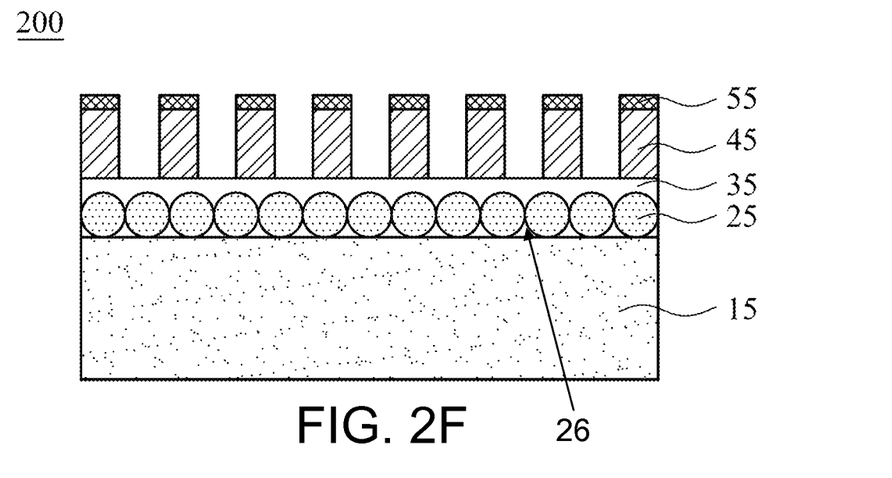

Then, the metal bonding layer 55 is patterned by lithography and an etching process to form a nano-rod structure, wherein the nano-rod structure includes the buffer layer 35, the epitaxial light-emitting structure 45 formed on the buffer layer 35, the contact metal layer 75 (if any), and the metal bonding layer 55, as shown in FIG. 2F.

Figure 2G:
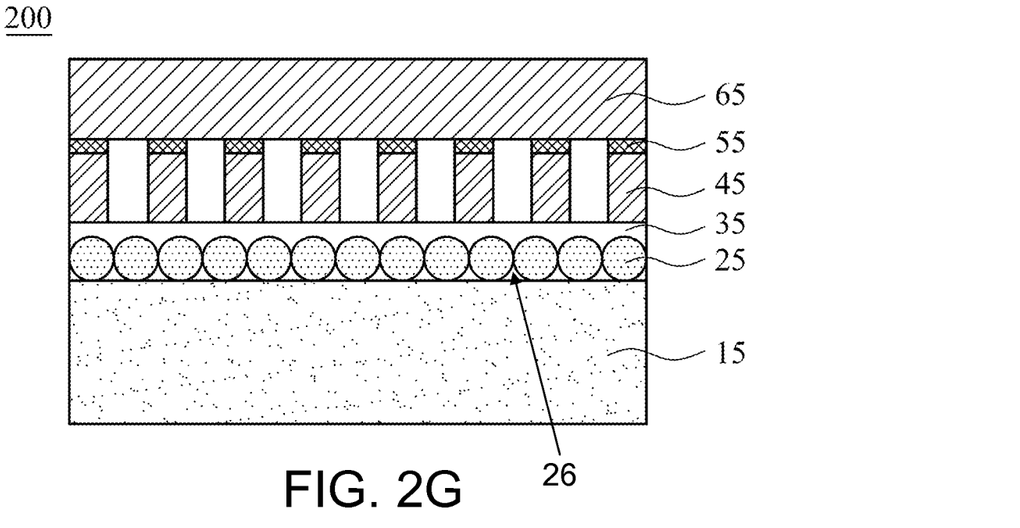

The metal bonding layer 55 is bonded to the thermally conductive substrate 65, as shown in FIG. 2G, after the nano-rod structure is formed, wherein a bonding pad (not illustrated) may be optionally formed on the thermally conductive substrate 65, such that the metal bonding layer 55 and the thermally conductive substrate 65 are bonded by the bonding pad.

Then, a wet etching process is performed to remove the sacrificial dielectric layer 25. The wet etching solution is such as an acid etching solution. For example, when the sacrificial dielectric layer 25 is formed by silicon dioxide, a solution containing hydrofluoric acid can be used in the wet etching process. In other embodiments, anyone who is skilled in the technology of the invention may select suitable etching solutions according to the materials of the sacrificial dielectric layer 25. Since the sacrificial dielectric layer 25 has a void structure formed between the sacrificial dielectric layer 25 and the substrate 15, the wet etching solution may enter the voids 26 to expedite the etching process. After the sacrificial dielectric layer 25 is wet etched, the substrate 15 is naturally separated from the other part of the LED device 200, as shown in FIG. 2F, to form the structure of the LED device 200 as shown in FIG. 2H, wherein the LED device 200 has been disposed upside-down.

For recycling the substrate 15, after the substrate 15 is removed, anyone who is skilled in the technology of the invention may remove the residuals from the buffer layer 35 and/or the epitaxial light-emitting structure 45 left on the substrate by using an etching solution including sulfuric acid and phosphate or any other generally known etching solutions.

Figure 2H:
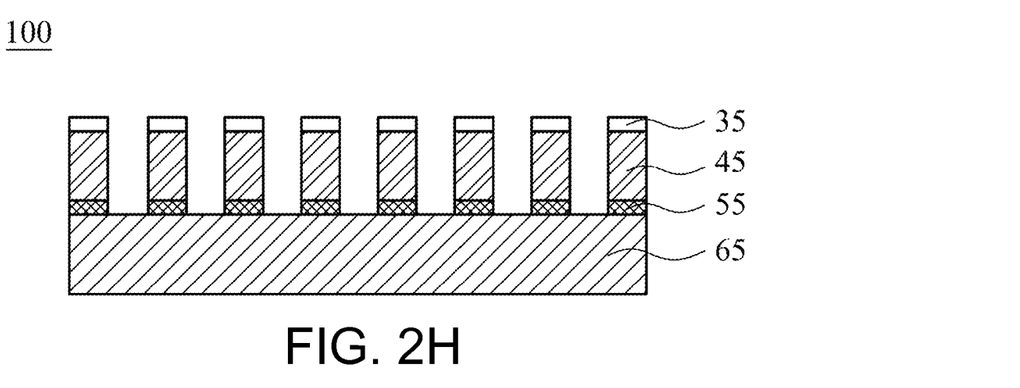

Although the buffer layer 35 is still disposed on the epitaxial light-emitting structure 45, as shown in FIG. 2H, the buffer layer 35 can also be wet etched and removed along with the sacrificial dielectric layer 25. In other embodiments, after the sacrificial dielectric layer 25 is wet etched to remove the substrate 10, the buffer layer 35 (not shown) on the epitaxial light-emitting structure 45 is dry etched and removed.

Figure 2I:
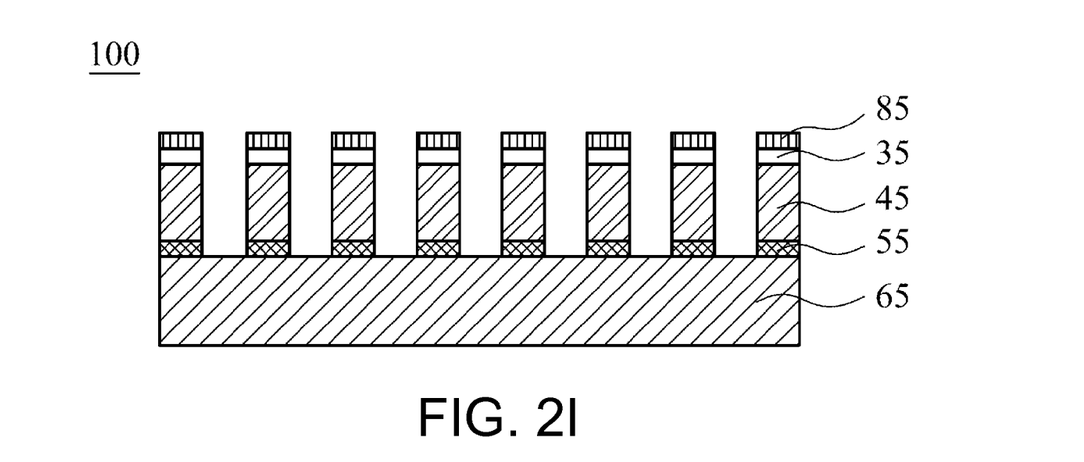

In some embodiments, after the nano-rod structure is formed, a conductive pad 85 is optionally formed on the epitaxial light-emitting structure 45, as shown in FIG. 2I. The materials of the conductive pad include Au, Ag, Cu, Al, Ni, Ti, other suitable metals, a combination thereof, or an alloy. It is noted that if the buffer layer 35 has been removed, then the conductive pad 85 is formed on the epitaxial light-emitting structure 45 of the nano-rod structure.

After the substrate 15 is removed, the thermally conductive substrate 65 is laser-cut along the nano-rod structure to obtain a plurality of grains.

In the present embodiment, by forming the sacrificial dielectric layer 25, which is a single- or multiple-layer structure containing voids, on the substrate 15, the subsequent process of removing the substrate 10 is made easier, so the method of the invention may replace conventional laser lift-off processes and have higher yields.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light-emitting semiconductor structure, comprising: a substrate; a dielectric layer in contact with the substrate, wherein the dielectric layer is a single-layer or multiple-layer spherical structure having a plurality of spheres defining voids, between the plurality of spheres and the substrate, that are not filled with any material; a buffer layer on the dielectric layer; a first conductive type semiconductor layer on the buffer layer; a multiple quantum well on the first conductive type semiconductor layer; and a second conductive type semiconductor layer on the multiple quantum well, wherein the voids are disposed between the multiple quantum well and the substrate and separated from the multiple quantum well by the buffer layer.

2. The light-emitting semiconductor structure according to claim 1, wherein the substrate is a sapphire substrate, a silicon carbide substrate, a GaN substrate, an AlN substrate, a silicon substrate, or a metal substrate.

3. The light-emitting semiconductor structure according to claim 1, wherein a dielectric material of the dielectric layer comprises silica, silicon nitride, silicon oxynitride, or a combination thereof.

4. The method for fabricating LED device according to claim 1, wherein a diameter of the spherical structure is about 1~1000 nanometers.

5. The light-emitting semiconductor structure according to claim 1, wherein the dielectric layer is a single- or multiple-layer mesh structure.

6. The light-emitting semiconductor structure according to claim 1, wherein the buffer layer comprises single layer or multiple layers including AlN.

7. The light-emitting semiconductor structure according to claim 1, wherein the buffer layer is formed by a metal organic chemical vapor deposition process or a physical vapor deposition process.

8. The light-emitting semiconductor structure according to claim 1, wherein a thickness of the buffer layer is 10~50 nanometers.

* * * * *